US011004662B2

(12) United States Patent
Tan et al.

(10) Patent No.: US 11,004,662 B2
(45) Date of Patent: May 11, 2021

(54) TEMPERATURE CONTROLLED SPACER FOR USE IN A SUBSTRATE PROCESSING CHAMBER

(71) Applicant: Lam Research Corporation, Fremont, CA (US)

(72) Inventors: Taide Tan, Tigard, OR (US); Huatan Qiu, Lake Oswego, OR (US); Ryan Senff, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 489 days.

(21) Appl. No.: 15/432,314

(22) Filed: Feb. 14, 2017

(65) Prior Publication Data

US 2018/0233326 A1    Aug. 16, 2018

(51) Int. Cl.
*H01J 37/32* (2006.01)
*C23C 16/455* (2006.01)
*C23C 16/458* (2006.01)
*C23C 16/507* (2006.01)

(52) U.S. Cl.
CPC ...... *H01J 37/3244* (2013.01); *C23C 16/4585* (2013.01); *C23C 16/45565* (2013.01); *C23C 16/507* (2013.01); *H01J 37/3211* (2013.01); *H01J 37/32513* (2013.01); *H01J 37/32724* (2013.01); *H01J 2237/3321* (2013.01)

(58) Field of Classification Search
CPC ................. H01J 37/32513; H01J 37/3244
See application file for complete search history.

(56) References Cited

U.S. PATENT DOCUMENTS

| | | | | |
|---|---|---|---|---|
| 5,914,050 A * | 6/1999 | Comita | ............... | C23C 16/4405 118/715 |
| 6,074,512 A * | 6/2000 | Collins | ................. | C23C 16/517 118/723 AN |
| 6,129,808 A * | 10/2000 | Wicker | ................. | H01J 37/321 118/723 E |
| 6,192,827 B1 * | 2/2001 | Welch | ............... | H01J 37/32458 118/723 E |
| 6,192,829 B1 * | 2/2001 | Karazim | ............... | H01J 37/321 118/723 AN |
| 6,227,140 B1 * | 5/2001 | Kennedy | ............. | C23C 16/4401 118/723 R |

(Continued)

*Primary Examiner* — Keath T Chen
(74) *Attorney, Agent, or Firm* — Penilla IP, APC (57) ABSTRACT

A system for processing a substrate includes a chamber having a chamber wall that defines a lower chamber portion and an upper chamber wall that defines an upper chamber portion. A showerhead is disposed in the upper chamber portion. A pedestal with a support for the substrate is disposed in the lower chamber portion and oriented below the showerhead, such that a processing region is defined between the support of the pedestal and the showerhead. A spacer is disposed between the showerhead and the lower chamber wall of the lower chamber portion. The spacer is defined by an annular body that includes a vertical component. The annular body also includes a side extension that is disposed outside of the processing region and projects radially away from the vertical component. The annular body includes a groove that is formed in the side extension so as to surround the vertical component of the annular body. A heating element is embedded in the groove of the side extension.

26 Claims, 8 Drawing Sheets

(56) References Cited

U.S. PATENT DOCUMENTS

| | | | | |
|---|---|---|---|---|
| 6,308,654 | B1 * | 10/2001 | Schneider | H01J 37/321 118/723 I |
| 9,196,462 | B2 * | 11/2015 | Carducci | H01J 37/3244 |
| 2002/0076490 | A1 * | 6/2002 | Chiang | C23C 16/0227 427/248.1 |
| 2002/0170677 | A1 * | 11/2002 | Tucker | H01J 37/321 156/345.48 |
| 2006/0054087 | A1 * | 3/2006 | Seo | C23C 16/4401 118/715 |
| 2006/0086492 | A1 * | 4/2006 | Kato | F24H 1/102 165/177 |
| 2008/0178797 | A1 * | 7/2008 | Fodor | C23C 16/46 118/75 |
| 2009/0236313 | A1 * | 9/2009 | Qiu | H01J 37/3244 216/67 |
| 2009/0236314 | A1 * | 9/2009 | Chen | H01J 37/32091 216/67 |
| 2010/0304571 | A1 * | 12/2010 | Larson | H01L 21/67103 438/710 |

* cited by examiner

TEMPERATURE CONTROLLED SPACER FOR USE IN A SUBSTRATE PROCESSING CHAMBER

FIELD OF THE INVENTION

The present embodiments relate to components used in semiconductor processing tools, and more particularly, to a temperature controlled spacer used in chambers for processing wafers.

BACKGROUND

Description of the Related Art

A semiconductor substrate is exposed to various fabrication processes to generate semiconductor devices. The processes that are used include deposition process, etching process, patterning process, among others. The deposition process is used to deposit a film or layer of material onto the substrate surface. Some of the deposition processes that are well-known in the industry include chemical vapor deposition (CVD—e.g., plasma enhanced CVD), physical vapor deposition, atomic layer deposition, electrochemical deposition, among others. In case of plasma enhanced CVD, the plasma is either generated in-situ within a processing region defined in the chamber or is remotely generated and supplied to the processing region. The latter process is called Remote Plasma CVD (RPCVD). The CVD is used to deposit conformal films on the substrate surface.

The effectiveness of the fabrication process can be measured from the quality of devices formed on the substrate surface and the device yield, which in turn, is largely based on the performance of the plasma particles. Plasma particle performance is a function of the temperature within a region, such as a processing region, where the plasma is received to treat the substrate. Thus, plasma particle performance may be enhanced by increasing a surface temperature within the processing region from room temperature to a higher value, with the best particle performance, in some instances, happening when the surface temperature reaches between 120°-150° C. Surface temperature within the processing region varies based on temperature of each of the surfaces that encompass the processing region, such as showerhead at the top, side walls of the chamber surrounding the processing region, the substrate at the bottom, to name a few. The side walls of the chamber, in some examples, may be part of a top electrode (e.g., disposed in the top portion of the chamber) and may include a spacer at the periphery of the top electrode to act as a coupling interface with the bottom electrode (e.g., pedestal). In other examples, the side walls of the chamber may be part of the bottom electrode with a spacer disposed at the periphery of the bottom electrode to act as a coupling interface with the top electrode.

Currently, the side wall of the spacer is not temperature controlled and the dimensions of the spacer are random. Improper dimensions causes issues, such as introduction of more particle counts on the substrates, non-uniform gas flow, unwanted radical recombination reaction on the side walls, peel off due to surface stress and accumulation, etc.

It is in this context that embodiments of the inventions arise.

SUMMARY

Embodiments of the disclosure include systems, apparatuses, and methods that provide ways to improve particle performance by employing a spacer with an embedded high power tubular heating element within a process chamber used to perform one or more fabrication operations on a surface of a substrate. The tubular heating element is used to control inner wall temperature of the spacer at an ideal temperature range so as to provide optimal temperature profile within the process chamber during various fabrication processes. Structure and dimensions of the spacer are defined so as to improve heat transfer within the chamber, smoothen gas flow profile between the showerhead, pedestal and the spacer, reduce recombination of reaction radicals on the sidewalls, reduce non-uniformity, increase deposition rate and overall enhance particle performance, as a result. The structure and dimension of the spacer is also configured to reduce heat loss from the spacer and reduce heat transfer from the spacer to a showerhead to which the spacer is coupled.

In one embodiment, a system for processing a substrate is disclosed. The system includes a chamber having a chamber wall that defines a lower chamber portion and having an upper chamber portion. The upper chamber portion has a plasma chamber. A showerhead is disposed between the plasma chamber of the upper chamber portion and a processing region. A pedestal is disposed in the lower chamber portion. The pedestal has a support for the substrate, when present. The support of the pedestal is configured to be oriented under the showerhead such that the processing region is defined between the support of the pedestal and the showerhead. A spacer is disposed between the showerhead and the chamber wall of the lower chamber portion. The spacer is defined by an annular body that includes a vertical component. The vertical component defines a sidewall that surrounds the processing region. The annular body also includes a side extension that is disposed outside of the processing region. The side extension projects radially away from the vertical component. The annular body includes a groove that is formed in the side extension. The groove is configured to surround the vertical component of the annular body. A heating element is embedded in the groove of the side extension.

In another embodiment, a chamber for processing a substrate is disclosed. The chamber includes a lower chamber wall that defines a lower chamber portion and an upper chamber wall that defines an upper chamber portion. A showerhead is disposed in the upper chamber portion. A pedestal is disposed in the lower chamber portion. The pedestal has a support for the substrate, when present. The support of the pedestal is configured to be oriented below the showerhead such that the processing region is defined between the support of the pedestal and the showerhead. A spacer is disposed between the showerhead and the lower chamber wall of the lower chamber portion. The spacer is defined by an annular body that includes a vertical component. The vertical component defines a sidewall that surrounds the processing region. The annular body also includes a side extension that is disposed outside of the processing region. The side extension projects radially away from the vertical component. The annular body includes a groove that is formed in the side extension. The groove is configured to surround the vertical component of the annular body. A heating element is embedded in the groove of the side extension.

Other aspects and advantages of the invention will become apparent from the following detailed description, taken in conjunction with the accompanying drawings, illustrating by way of example the principles of the invention.

DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Embodiments of the disclosure provide various details of a system that is used for processing semiconductor substrates. It should be appreciated that the present embodiments can be implemented in numerous ways, such as a process, an apparatus, a system, a device, or a method. Several example embodiments are described below.

A system used for processing a substrate is configured to supply plasma to a processing region defined within a process chamber in which a substrate undergoes a fabrication operation (e.g., a PECVD process). In one embodiment, the plasma is generated remotely and supplied to the processing region through a showerhead. In another embodiment, the plasma is generated in-situ within the processing region. The plasma may be used, for example, to perform a deposition operation on a top surface of the substrate.

The system used for processing a substrate includes a chamber that is defined by an upper chamber portion and a lower chamber portion. The upper chamber portion includes a showerhead that is configured to supply plasma. The lower chamber portion includes a pedestal that is configured to provide support for a substrate during processing. A processing region is defined between the showerhead and a supporting surface of the pedestal and is enclosed by the showerhead on the top, the support surface of the pedestal in the bottom, and side walls of the chamber. During a deposition process, plasma provided to or generated in the processing region is used to deposit a thin film layer on a surface of the substrate that is exposed to the plasma. The deposition process can be optimized by keeping the surface temperature within the processing region at an ideal range. Surface temperature of the processing region depends on the temperature of the various surfaces that enclose and define the processing region. The temperature of the showerhead surface and the support surface of the pedestal are influenced by the temperature of the plasma. The temperature of the sidewalls of the chamber is usually at a lower temperature (e.g., between about 40°-50° C.). Plasma particle performance can be enhanced by keeping the temperature of the sidewall at a stable value within an ideal range (e.g., between about 80° C. to about 150° C.). In some embodiments, the ideal temperature range may depend on the type of chemistry that is used in the chamber.

A spacer is disposed immediately below the showerhead and between the showerhead and the chamber wall of the lower chamber portion. The spacer is defined by an annular body and includes a vertical component and side extension. The vertical component of the spacer defines a sidewall that surrounds the processing region within the process chamber. The side extension extends radially outward from the vertical component such that the side extension is disposed outside the processing region. The vertical component of the spacer is attached to a bottom surface of the showerhead and the side extension is configured to sit on top of the chamber wall of the lower chamber portion. A groove is defined on a top surface of the side extension. A heating element coupled to a heat source is embedded within the groove of the spacer. The surface temperature of the sidewall of the processing region is controlled by controlling the heat provided by the heating element to the vertical component of the spacer. Maintaining the sidewall of the spacer at an optimal thermal condition results in minimizing stress and peel off of depositions, improving plasma flow contours, and enhancing particle performance. With the general understanding of the invention, specific embodiments will now be described with reference to the various Figures.

Figure 1:
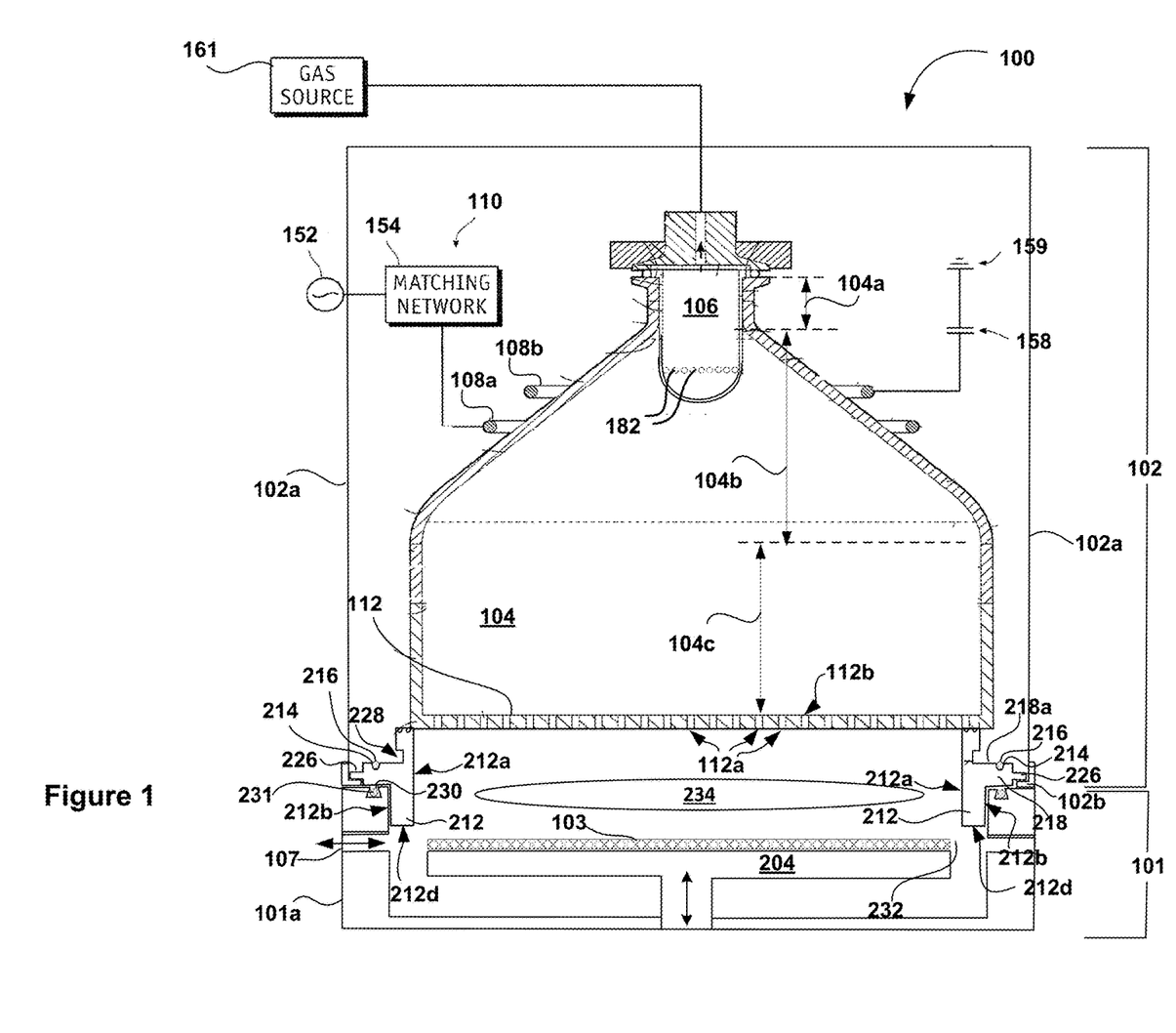
FIG. 1 illustrates a close-up cut-out view of a processing region defined within a system that is configured to perform a deposition process on a wafer, in one implementation.

FIG. 1 is a simplified, cross-sectional view of a chamber within a system 100 used for processing a substrate, in accordance with an embodiment of the invention. The chamber illustrated in FIG. 1 is a single station chamber, in that a single substrate is processed at any given time.

Referring to FIG. 1, the chamber includes a chamber wall 101a that defines a lower chamber portion 101 and a chamber wall 102a that defines an upper chamber portion 102. The lower chamber portion 101 houses a pedestal 204 that includes a support surface for a substrate 103, when the substrate 103 is received in the chamber for processing. The lower chamber portion 101 also includes a lift mechanism (not shown) to move the pedestal 204 along a vertical axis, and facilities and controls (not shown) to operate different components of the system 100, including controls to operate the lift mechanism, controls to supply power to different components of the system, etc.

The upper chamber portion houses a showerhead 112. The showerhead 112 is disposed above the support surface of the pedestal 204 so as to define the processing region 234 there-between. The showerhead 112 includes a plurality of nozzles 112a that are used to supply plasma to the processing region 234. In one embodiment, immediately above the showerhead 112 is a plasma chamber 104 that is configured to receive gas chemistry and generate plasma. The plasma chamber 104 is coupled to a gas source, such as a reservoir (161) of the gas chemistry. A gas flow distribution receptacle in the form of a diffuser 106 is provided within the plasma chamber 104. The diffuser 106 may have any number of shapes. In one embodiment illustrated in FIG. 1, the diffuser 106 includes a cup-shaped member having a rounded bottom section and a cylindrical top section. The diffuser is made of a non-conductive material capable of withstanding corrosion when exposed to the gas chemistry. The diffuser 106 includes a plurality of injection openings 182 to diffuse the gas chemistry that is being introduced into the plasma chamber 104. In some embodiments, the plurality of injection openings 182 is disposed along a horizontal ring in the rounded bottom section of the cup-shaped member, as shown in FIG. 1. In other embodiments, the plurality of injection openings 182 is disposed throughout the cup-shaped member.

In one embodiment, the plasma chamber 104 is shaped in the form of a cone with a narrow neck section 104a at the top in which the diffuser 106 is received, a conical section 104b immediately below the narrow neck section 104a, and a broader cylindrical section 104c at the bottom immediately below the conical section 104b and above a top surface 112b of the showerhead 112.

One or more coils 108 (108a, 108b shown in FIG. 1) are disposed to encircle a portion of the conical section 104b of the plasma chamber 104. The coils 108 are coupled to an energy source 110, which supplies the electricity to the coils 108. Electric field supplied by the energy source 110 is applied by the coil 108 to ionize the gas chemistry received in the conical section 104b of the plasma chamber 104 to generate plasma. The generated plasma includes reactive species, such as electrons, ions, and reactive radicals that are used to deposit a layer of material onto a surface of the substrate 103 when applied to the substrate through the nozzles 112a of the showerhead 112.

A spacer 212 is disposed immediately below the showerhead 112 and between the showerhead 112 and chamber wall 101a of the lower chamber portion 101. The spacer 212 includes an annular body that is disposed along an outer periphery on a bottom surface of the showerhead 112 facing the pedestal 204. In one embodiment, the spacer 212 is attached to the bottom surface of the showerhead 112 using mechanical means. In an alternate embodiment, the spacer 212 is attached to the bottom surface of the showerhead 112 using non-mechanical means. Sidewall 212a of the annular body of the spacer 212 facing the processing region 234 defines an inner sidewall. The spacer 212 includes a side extension 218 that extends radially outward from the sidewall 212a of the annular body of the spacer 212 such that the side extension 218 is formed outside the processing region 234. In one embodiment, the side extension 218 extends outward from a center region of the spacer 212. In other embodiments, the side extension 218 may extend outward from a top region or a bottom region of the spacer 212. The side extension 218 is configured to sit on top of the chamber wall 101a of the lower chamber portion 101 of the chamber, when the upper chamber portion 102 is lowered. In one embodiment, a groove 230 is defined on the top surface of the chamber wall 101a of the lower chamber portion 101. In one embodiment, an O-ring 231 is embedded in the groove 230 such that a portion of the O-ring 231 extends outside the groove 230. The O-ring 231 is used to seal the processing region 234, when the upper chamber portion is lowered, by allowing the side extension 218 of the spacer 212 to push down on the O-ring 231 as the side extension 218 sits on the chamber wall 101a of the lower chamber portion 101.

A groove 214 is formed on a top surface of the side extension 218 of the spacer 212. The groove 214 is configured to encircle the sidewall 212a of the annular body of the spacer 212. A heating element 216 is embedded in the groove 214. The heating element 216, in one embodiment, is coupled to a power source at a first end to provide heat to the spacer 212 and is connected to an electrical ground at a second end. The heat from the heating element 216 is used to heat the sidewall 212a of the spacer 212 so as to maintain optimal thermal condition within the processing region 234. In another implementation, the second end of the heating element 216 may be connected to an AC phase connection instead of being connected to the electrical ground 259. In an alternate embodiment, a first end of the heating element 216 may be connected to a first alternate current (AC) phase connection and the second end of the heating element 216 may be connected to a second AC phase connection. In yet another embodiment, the second end of the heating element 216 may be connected to a neutral phase while the first end is connected to a AC phase connection. In each of the embodiments in which the first and/or the second end of the heating element 216 is connected to the AC phase connection, an AC line filter may be provided between the AC phase connection and the heating element 216 to attenuate conducted radio frequencies (also known as electromagnetic interference (EMI)) between the power source and the heating element 216.

Details of the various components within the upper chamber portion will now be described. In one embodiment, a bottom portion of the chamber wall 102a of the upper chamber portion 102 substantially surrounds the side extension 218 of the spacer 212. The bottom portion of the chamber wall 102a includes an extension lip 102b that projects radially inward from a bottom side of the chamber wall 102a toward the processing region 234. The extension lip 102b reaches below a portion of the side extension 218 of the spacer 212 substantially supporting the spacer 212 so as to enable lifting of the spacer 212 with the upper chamber portion 102, when the upper chamber portion 102 is moved away from the lower chamber portion 101. A window 107 is defined in the chamber wall 101a of the lower chamber portion 101 in a location that allows un-hindered movement of the substrate 103 into and out of the chamber.

In the embodiment illustrated in FIG. 1, the plasma chamber 104 is included in the upper chamber portion 102 and is disposed immediately above a showerhead 112. In another embodiment, the plasma chamber 104 may be a stand-alone module that is coupled to the showerhead 112 of the system 100. In such embodiment, the plasma chamber 104 is configured to generate plasma remotely (i.e., away from the processing region) and supply to the processing region 234 so that a thin layer of material may be deposited on a surface of the substrate 103 during a deposition operation performed in the plasma chamber 104. The plasma chamber 104 is not restricted to use in a system that is engaged to perform a deposition operation but could also be used with other systems that are used to perform other plasma fabrication operations, such as plasma etching, plasma stripping or ashing, sputtering, plasma spraying, and the like.

The substrate 103 may be made of relatively pure silicon, germanium, gallium arsenide, or other semiconductor material typically used in the semiconductor industry, or of silicon admixed with one or more additional elements such as germanium, carbon, and the like. In one embodiment, the substrate 103 may be a semiconductor substrate having previously deposited layers from other semiconductor fabrication process. In another embodiment, the substrate 103 may be a component, such as a sheet of glass, ceramic or metal that may be subjected to plasma processing.

As mentioned, the plasma chamber 104 includes a narrow neck section 104a, a conical section 104b, a cylindrical section 104c, one or more coils 108, an energy source 110 and a diffuser 106 that acts as a gas flow distribution receptacle.

The plasma chamber 104 is configured to receive gas chemistry and apply electric field to ionize the gas chemistry, for example, to generate plasma (e.g., species such as electrons, ions, reactive radicals, etc.). In an exemplary embodiment, the plasma chamber 104 is made of a material that is capable of enhancing the electric field. For example, the plasma chamber 104 may be made of a dielectric material. In one embodiment, the narrow neck section 104a of the plasma chamber 104 is defined at the top of the plasma chamber 104 and is coupled to a gas source, such as a reservoir 161, that provides gas chemistry to the plasma chamber 104. A diffuser 106 is defined in the plasma chamber 104 at the narrow neck section 104a. The diffuser 106 includes a plurality of injection openings 182 and is configured to introduce gas chemistry into the conical section 104b of the plasma chamber 104. The conical section 104b extends outward from below the narrow neck section 104a of the plasma chamber 104 and is configured to generate plasma.

Sidewall of the conical section 104b has a thickness that is suitable for generating plasma and is sufficient not to interfere with the electric field produced by the coil 108. The cylindrical section 104c extends immediately below the conical section 104b and is configured to contain the generated plasma before the plasma is introduced to the processing region 234 via the showerhead 112. The conical section 104b, the cylindrical section 104c and the sidewall of the plasma chamber 104 are shaped so as to direct the plasma toward the showerhead 112. In one embodiment, the sidewalls of the different sections of the plasma chamber 104 have varying thickness along its axial length. In another exemplary embodiment, the sidewalls of the different sections of the plasma chamber 104 have a substantially uniform thickness along its axial length.

In one embodiment, the sidewall of the conical section 104b varies along its axial length. According to an exemplary embodiment of the present invention, axial lengths of the various sections (narrow neck section 104a, conical section 104b, and the cylindrical section 104c) of the plasma chamber 104 are substantially unequal to each other. For example, the narrow neck section 104a has an axial length that is sufficient to stabilize the gas introduced into the plasma chamber 104, but not long enough to impede gas flow into the conical section 104b of the plasma chamber 104. The axial length of the conical section 104b may be longer than the cylindrical section 104c. In one embodiment, the axial length of the narrow neck section 104a is less than that of the conical section 104b and the cylindrical section 104c. The axial length of the cylindrical section 104c is less than the conical section 104b. In other embodiments, the axial lengths of the narrow neck section 104a, the conical section 104b and the cylindrical section 104c may be longer or shorter, depending on the particular dimensions of the surrounding components. In yet other embodiments, the axial lengths of the narrow neck section 104a, the conical section 104b and the cylindrical section 104c may be equal.

In one embodiment, a diameter of the narrow neck section 104a is substantially uniform. In one embodiment, the diameter of the conical section 104b increases from the narrow neck section 104a to the cylindrical section 104c, and the diameter at the cylindrical section 104c is substantially uniform and of a size that covers at least a diameter of the processing region 234. In another embodiment, the plasma chamber 104 may not include a narrow neck section 104a.

In one embodiment, the showerhead 112 may have a plate-like configuration and include a plurality of nozzles 112a disposed along the bottom surface to introduce the plasma to the processing region 234. In some embodiments, the nozzles 112a are distributed uniformly throughout the bottom surface of the showerhead 112. In other embodiments, the nozzles 112a may be distributed uniformly in one section of the bottom surface. For example, in embodiments in which only a desired portion of the substrate 103 is to be subjected to a plasma process, the nozzles 112a are distributed on the bottom surface of the showerhead 112 corresponding to the size of the desired portion. In some embodiments, a diameter of the showerhead 112 may be at least as large as a diameter of the substrate 103. In another exemplary embodiment, the diameter of the showerhead 112 is smaller than or larger than the diameter of the substrate 103.

The coil 108 is disposed on the outside of the conical section 104b of the plasma chamber 104 so as to encircle it. Electric field provided by the coil 108 is sufficient to generate plasma within the plasma chamber 104. The coil 108 is connected to an energy source 110 to provide an electric field to the gas chemistry that flows through the conical section 104b of the plasma chamber 104. In an exemplary embodiment, the coil 108 is a single member made of a conductive material, such as copper, that is wound once around the conical section 104b of the plasma chamber 104. In another embodiment, the coil 108 is wound twice around the conical section 104b of the plasma chamber 104. In this embodiment, a first end of the coil 108 is electrically coupled to the energy source 110, a second end is coupled to an electrical ground 159 and the length of the coil 108 is wound twice (108a, 108b portion of the coil 108) around the conical section 104b of the plasma chamber 104. In some embodiments, the second winding may be above or below the first winding. In some embodiments, a capacitor 158 may be disposed between the second end of the coil 108 and the electrical ground 159. Due to the geometry of the conical section 104b, a diameter of the first winding is larger or smaller than the diameter of the second winding depending on the first winding being below or above the second winding. In an alternate embodiment, instead of a coil 108 being wound around the conical section 104b twice, two coils 108a, 108b, may be disposed such that each coil (108a, 108b) is wound around the conical section 104b of the plasma chamber 104 one or more times. As in the case with a single coil, a first end of each of the two coils 108a, 108b is connected to the energy source 110, and the second end is connected to the electrical ground 159.

The plasma is generated in the conical section 104b of the plasma chamber 104 with the plasma density being maximum in a region that is closest to a first end of the coil 108 as the first end of the coil 108 that is coupled to the energy source dissipates more energy into the gas chemistry than any other portion along the length of the coil 108. In the case where the coil 108 is wound twice around the conical section 104b, the plasma is generated closest to the first winding 108a of coil 108 as the first winding 108a dissipates more energy from the energy source to the gas chemistry than the second winding 108b of the coil 108. The energy dissipated from the additional windings (e.g., 108b) may be used to enhance uniformity of the plasma generated within the conical section 104b of the plasma chamber 104. Although in the embodiment illustrated in FIG. 1, the plasma generator region of the plasma chamber 104 is represented as a conical shaped structure, other shapes may also be used, including a dome shaped structure, cuboidal shaped structure, etc. In case of the dome shaped or cuboidal shaped structure, there may not be a narrow neck section 104a.

In one embodiment, the energy source 110 may be a radio frequency (RF) voltage source or other source of energy capable of energizing the coil 108 to form an electric field. In an exemplary embodiment, the energy source 110 includes an RF generator 152 that is capable of operating at a desired frequency (e.g., a frequency range of between about 0.2 MHz to about 20.0 MHz). In an exemplary embodiment, the energy source 110 may include a matching network 154 disposed between the RF generator 152 and the coil 108. The matching network 154 may be an impedance matching network that is configured to match an impedance of the RF generator 152 to an impedance of the coil 108.

In one embodiment, a capacitor 158 is included between the second end of the coil and electrical ground 159 so as to limit voltage flow through the coil 108. In this regard, the capacitor 158 is selected to have a capacitance that limits the voltage flow through the coil 108 to a threshold voltage. In an example, the capacitor 158 may be selected for an ability to reduce voltage flow through the coil 108 to about 50% of an initial voltage input. By positioning a capacitor 158 closer to the electrical ground, as opposed to including one or more capacitors between the energy source 110 and the first end of the coil 108 or anywhere in-between the first end and the second end of the coil 108, a lower voltage may be used to form plasma in the plasma generator region (i.e., the conical section 104b). The location around the conical section 104b of the plasma chamber 104 where the coil 108 is disposed and the number of windings are defined so as to optimize density and uniformity of plasma generated within the conical section 104b.

The gas chemistry received from the reservoir 161 may be diffused using the diffuser 106 before introducing into the plasma chamber 104. The diffuser 106 may have a distinct shape. As previously mentioned, in one embodiment, the diffuser 106 may have a rounded bottom section (i.e., cup-shaped section) and a cylindrical top section, and made of a non-conductive material that is capable of withstanding corrosion when exposed to the gas chemistry. Suitable materials for the diffuser 106 include, for example, dielectric materials such as quartz. The cylindrical top section of the diffuser 106 may have an open end that is coupled to the reservoir from which the gas chemistry is received and stored. The outer diameter of the cylindrical top section of the diffuser 106 may be less than the inner diameter of the narrow neck section 104a of the plasma chamber 104 so that the diffuser 106 can be easily received into the narrow neck section 104a. The injection openings 182 distributed throughout the diffuser 106 or radially in the cup-shaped bottom section allow an even distribution of the gas chemistry from the reservoir to the plasma chamber 104. The manner in which gas chemistry is injected into the plasma chamber 104 may be controlled by the number of injection openings, location of the injection openings, size of the injection openings, direction in which the injection openings are formed relative to an outer surface of the diffuser, dimension of the diffuser, etc. In one embodiment, about thirty to forty injection openings 182 are evenly distributed radially along the rounded bottom section to substantially inject the gas chemistry evenly into the conical section 104b of the plasma chamber 104. In one example, the injection openings 182 are not evenly spaced along the radial section of the cup-shaped bottom section. In other embodiments, more or fewer injection openings 182 may be included along the radial or longitudinal axis of the diffuser 106.

The energy source 110 energizes the coil 108 and an electric field is formed in the conical section 104b of the plasma chamber 104 encapsulated by the coil 108. The electric field ionizes the gas chemistry that flows through the conical section 104b to form plasma. The plasma may include, but is not limited to, ions, electrons, neutral species, excited species, reactive radicals, dissociated radicals, and any other species that may be produced when the gas chemistry flows through the electric field. The ionized gas is then distributed to a processing region 234 of the chamber through nozzles 112a the showerhead 112 that is integrated with the cylindrical section 104c of the plasma chamber 104.

A spacer 212 is disposed immediately below the showerhead 112. The spacer 212 includes an annular body that is oriented along an outer periphery of a bottom surface of the showerhead 112. The annular body includes a vertical component and a side extension 218. The vertical component 212e defines an inner sidewall that surrounds the processing region 234. Consequently, the sidewall 212a of the vertical component of the spacer 212 forms the inner wall of the processing region 234. The side extension 218 of the spacer 212 is configured to sit on the chamber wall 101a of the lower chamber portion 101. A groove (230 in FIG. 1A) in which an O-ring (231 in FIG. 1A) is embedded, is defined on a top surface of the chamber wall 101a. Thus, when the side extension 218 of the spacer 212 sits on top of the chamber wall 101a, the side extension 218 presses down on the O-ring 231 to substantially seal the processing region 234. In alternate embodiments, the processing region 234 may be sealed using vacuum seal. In such embodiments, the groove 230 may not be formed on the top surface of the chamber wall 101a.

The vertical component of the spacer 212 is disposed so as to define a gap 232 between the inner sidewall 212a of the spacer 212 and an outside edge of a support of the pedestal 204 disposed in the lower chamber portion 101. The gap 232 is defined to allow the gas chemistry to flow out of the processing region 234 through the gap 232 toward a drain (not shown) defined in the lower chamber portion 101. In some embodiments, the gap 232 is between about 0.20 inches to about 0.5 inches when the pedestal is in a process position. In a particular embodiment, the gap 232 is between about 0.35 inches.

A heating element is provided on a top surface of the side extension 218 of the spacer 212. A first end of the heating element 216 is coupled to a power source to provide power to heat the spacer 212 and a second end of the heating element 216 is electrically grounded. Heating the spacer 212 allows the surface temperature within the processing region to be maintained at an optimal level. Details of the geometry and different components of the spacer will be described in detail with reference to FIGS. 2A-2C.

It will be appreciated that, although FIG. 1 illustrates an embodiment of the plasma chamber 104 including certain components, additional components or components shaped differently than those shown in FIG. 1 may alternatively be employed. Alternately, the plasma chamber 104 may be a stand-alone chamber that is connected to the showerhead 112 to supply remotely-generated plasma to the processing region 234.

Figure 2A:
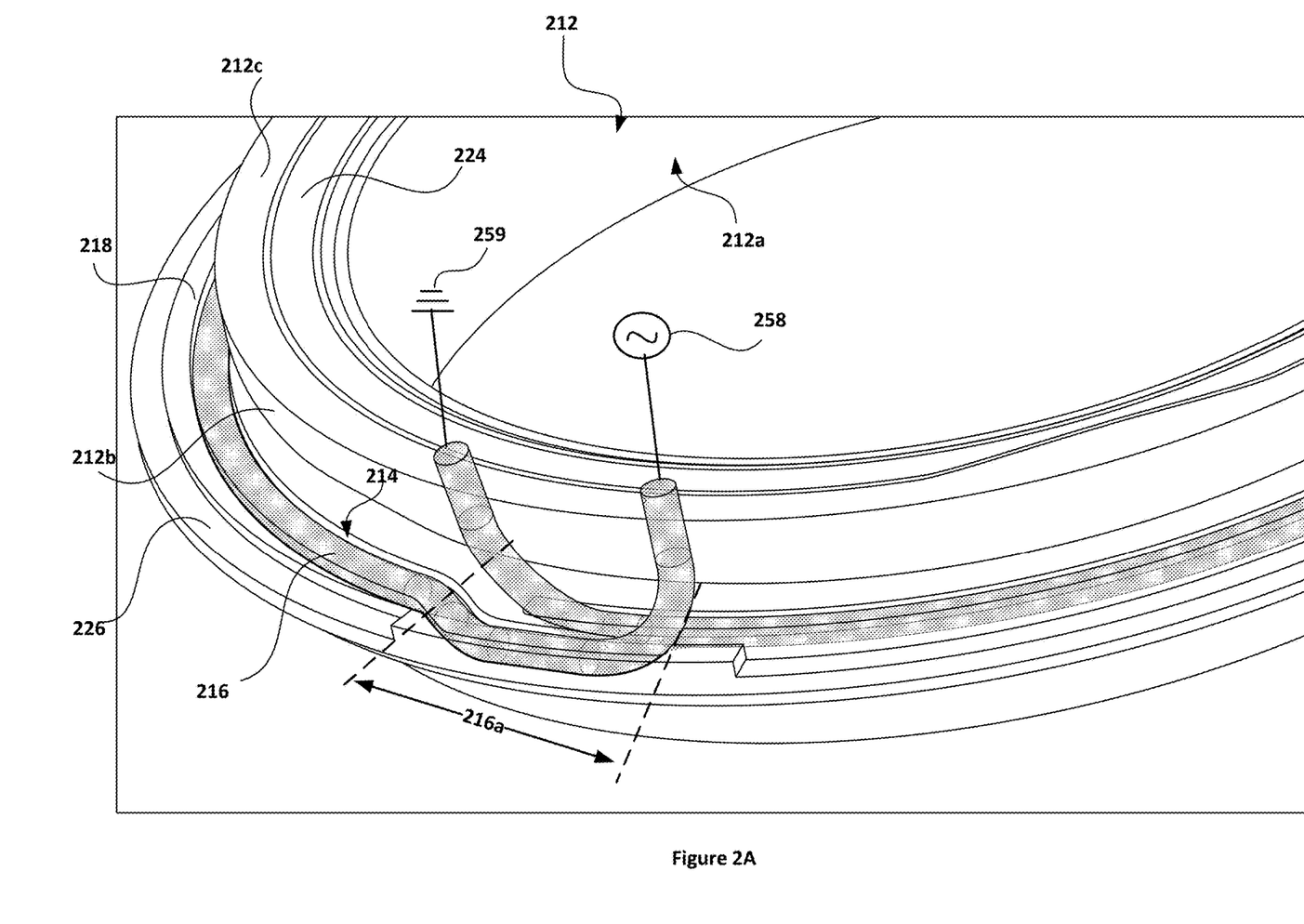
FIG. 2A illustrates a cross-section view of a portion of a spacer that is used within the system, in one implementation.

FIG. 2A illustrates a close-up view of an example spacer 212 used in the system, in one embodiment. A top surface of the side extension 218 of the spacer 212 includes a groove 214 to house a heating element 216. A first end of the heating element 216 received in the groove 214 is coupled to a power source 258 to provide heat to the spacer 212 and a second end to an electrical ground 259. In some embodiments, the groove 214 is configured such that portions 216a near the opposite ends of the heating element 216 overlap, as shown. The heating element 216 is a coil and an amount of overlap 216a of the heating element 216 is defined such that the temperature applied to the heating element 216 does not cause uneven heating in different portions of the spacer. In some embodiments, the temperature applied to the heating element 216 is controlled and the amount of overlap 216a is defined so that any increase in the temperature in portions of the spacer 212 in an area near the overlap 216a substantially compensates for loss of heat to the outside from the heating element 216 so as to ensure uniformity of temperature applied to the vertical component of the spacer 212. In one embodiment, the heating element 216 is a resistor coil. In some embodiments, the heating element 216 is encased in an outer shell. In some embodiments, the shell is made of stainless steel material.

A top surface 212c of the spacer 212 includes an inner lip 224. The inner lip 224 is used to support a liner. An outer wall of the side extension 218 includes an outer lip 226. The outer lip 226 is used to rest the spacer 212 on top of an extension lip defined in the bottom portion of the chamber wall 102a of the upper chamber portion 102 so that the spacer 212 can be lifted with the upper chamber portion 102.

Figure 2B:
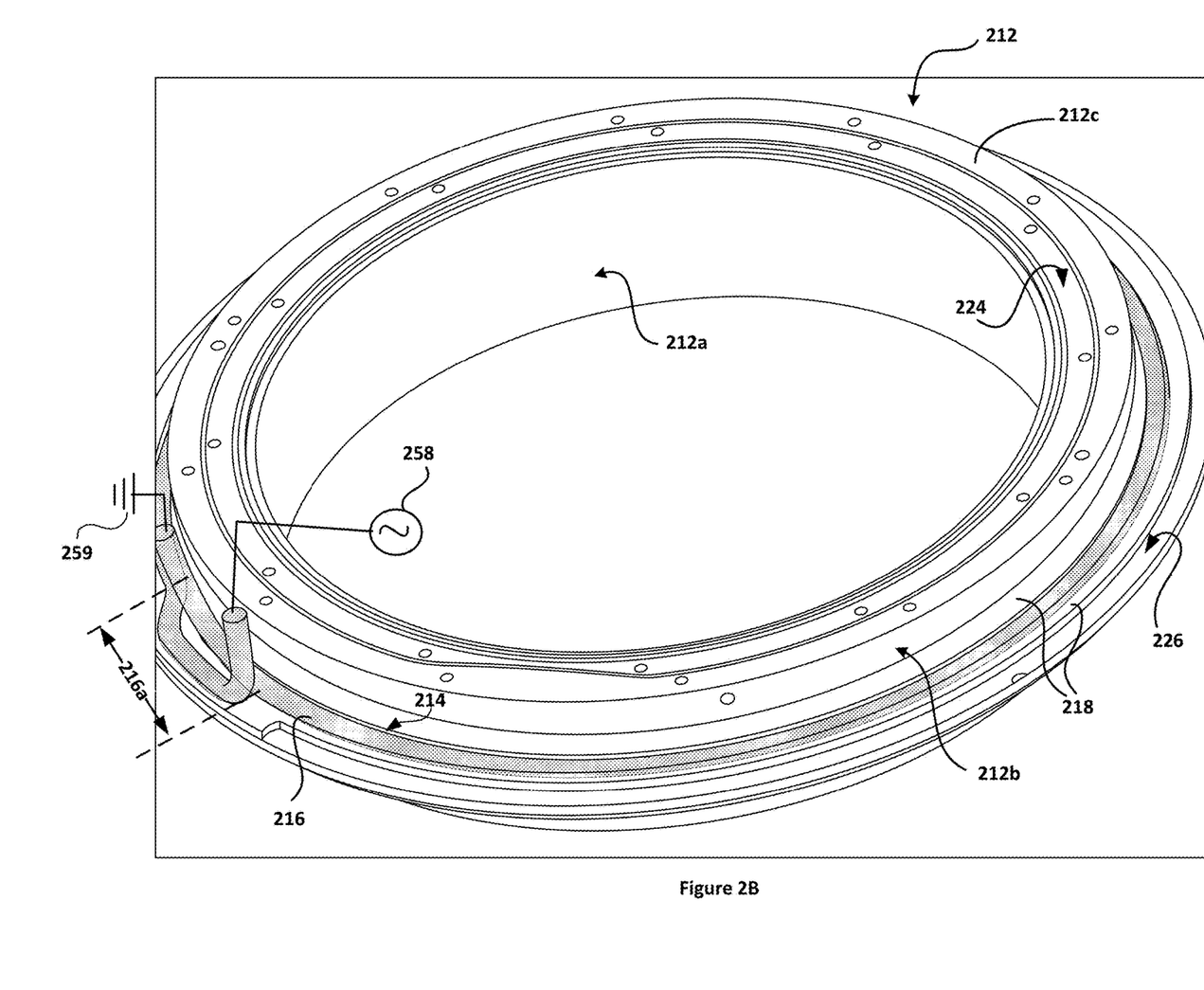
FIG. 2B illustrates a cross-sectional overview of the spacer identifying location of various components, in one implementation.
Figure 2C:
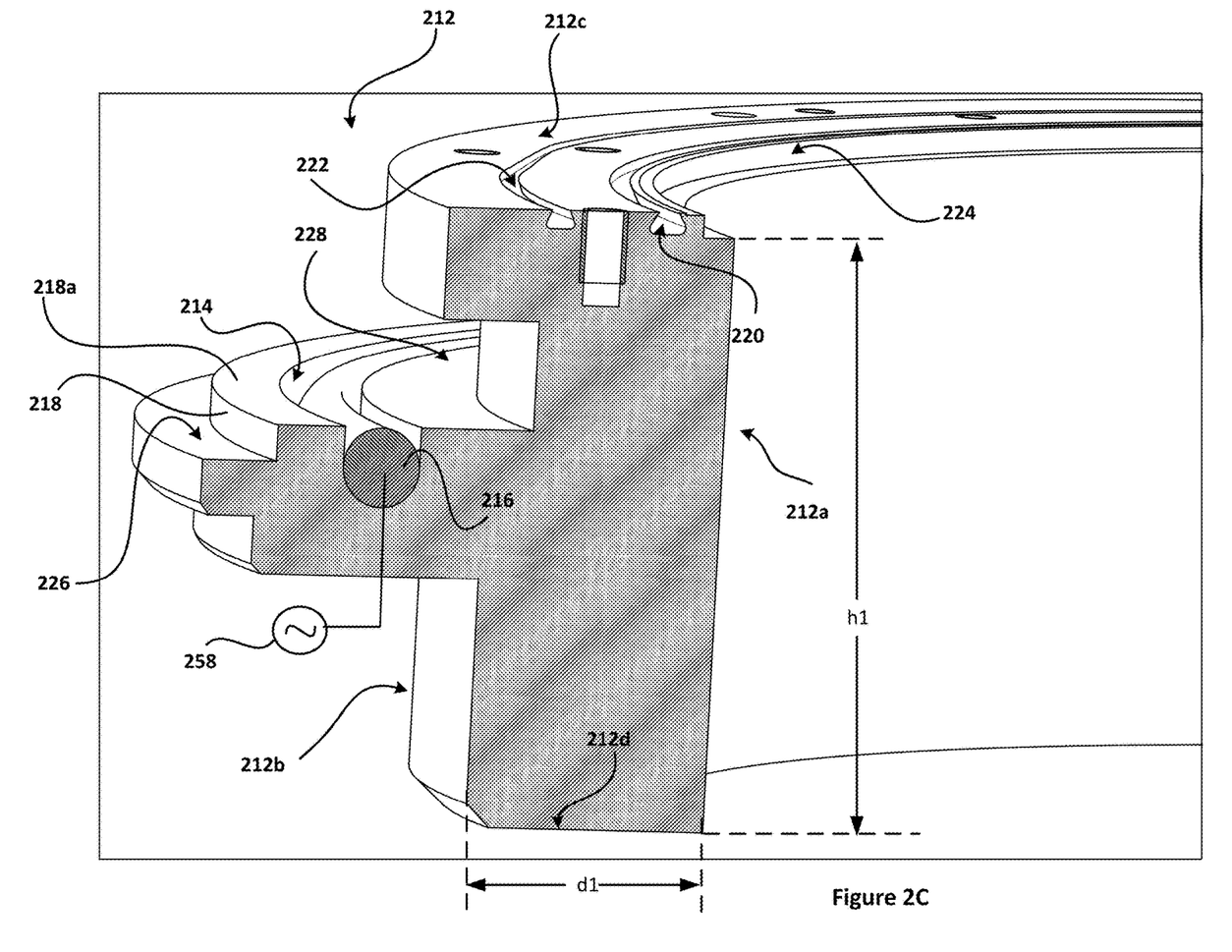
FIG. 2C illustrates a cut-off view of a portion of the spacer identifying different components, in one implementation.

FIG. 2B illustrates a close-up, overview of the spacer 212 used in a system and FIG. 2C illustrates a close-up cut-out view of a portion of the spacer, in one embodiment. Components that are common in FIGS. 2A, 2B and 2C are referenced using same reference numerals. Referring simultaneously to FIGS. 2A, 2B and 2C, a vertical component of the sidewall 212a of the spacer 212 lines the processing region 234. A groove 214 is defined on a top surface 218a of a side extension 218 of the spacer 212 that extends radially away from the processing region 234, such that the heating element 216 embedded in the groove 214 is on a side of the spacer 212 that is outside the processing region 234.

The spacer 212 is made of a conductive material. In one example embodiment, the conductive material is aluminum. The conductive material is not restricted to aluminum but may include other conductive materials that are conducive to the environment within the process chamber. In one embodiment, the sidewall 212a defined by the vertical component of the spacer 212 is designed to be rough or coarse. In one embodiment, the sidewall 212a is defined to have a coarseness factor in a range of between about 10 to about 20 micro inches. In one example embodiment, the coarseness factor is about 16 micro inches. Keeping the sidewall 212a of the spacer 212 rough enhances the particle performance within the chamber. For example, the rough sidewall 212a of the spacer 212 would cause the particles to stick to the sidewall 212a and not easily peel-off.

The spacer 212 includes additional grooves to accommodate different rings. For example, a second groove 220 is disposed proximate to an inner radius on a top surface 212c of the annular body of the spacer 212. An O-ring is embedded in the second groove 220. The O-ring in the second groove 220 is used to tightly couple the spacer 212 to the showerhead 112. A third groove 222 is disposed proximate to an outer radius on the top surface 212c of the annular body of the spacer 212. A radio frequency (RF) gasket is disposed in the third groove 222. The RF gasket is used for electrically grounding the spacer 212. An inner lip 224 is formed on an inner side of the top surface 212c of the spacer 212. In one embodiment, the inner lip 224 may be used to support a liner. In some embodiments, the inner lip 224 may be used to support liners of different materials and different surface treatments may be performed to test the effectiveness of the liner.

An outer lip 226 is formed along an outer wall of the side extension 218 of the spacer 212. The outer lip 226 may be used in lifting the spacer 212 with the upper chamber portion 102. For example, a bottom portion of the chamber wall 102a of the upper chamber portion 102 is designed to enclose the side extension 218 of the spacer 212. An extension lip 102b is defined at the bottom portion of the chamber wall 102a. The extension lip 102b projects radially inward from a bottom side of the chamber wall 102a toward the processing region 234, such that it extends underneath the outer lip 226 formed on the outer wall of the spacer 212. When the upper chamber portion 102 is lifted, the outer lip 226 of the spacer 212 sitting on top of the extension lip 102b is engaged to lift the spacer 212 along with other components of the upper chamber portion 102. Due to this, the outer lip 226 may also be called a "lifting lip". Defining a lip (i.e., the outer lip 226) in the outer sidewall 212b of the spacer 212 reduces amount of material used, thereby reducing the overall weight and cost of the spacer (due to reduction in the material used). Further, the outer lip 226 provides a smaller surface area, thereby reducing the amount of heat lost to the outside.

In one embodiment, the spacer 212 is fastened to the upper chamber portion 102 using fastening mechanisms. In an example embodiment, the fastening mechanism may include screws. It should be noted that the aforementioned fastening mechanism is only an example and that other types of fastening mechanism may also be used.

In one embodiment, a cutout 228 is defined along the outer sidewall 212b of the spacer 212 immediately above the side extension 218. In this embodiment, the cutout 228 is defined in the portion of the outer sidewall 212b that is above the side extension 218 and not in the portion below the side extension 218 of the outer sidewall 212b of the spacer 212. In other embodiments, additional cutouts may be defined on the outer sidewall 212b, including in the portion below the side extension 218, in the portion above the side extension 218, etc. In one embodiment, the cutout 228 is defined proximal to the groove 214 in which the heating element 216 is embedded. The cutout 228 acts to control temperature provided to the vertical component of the spacer 212 so that uniform temperature is delivered along the length and breadth of the vertical component of the spacer 212. Further, the cutout 228 minimizes heat transfer from the spacer 212 to the showerhead 112 in the upper chamber portion 102.

In one embodiment, a power source 258 connected to the heating element 216 is configured to provide heat to the heating element 216, which in turn provides heat to the vertical component of the spacer 212 so as to maintain the sidewall 212a of the spacer 212 at a steady temperature within an ideal range, during a fabrication operation. In one embodiment, the power source 258 is configured to provide about 200 volts of electricity to generate at least about 4 Kw of power.

Figure 4:
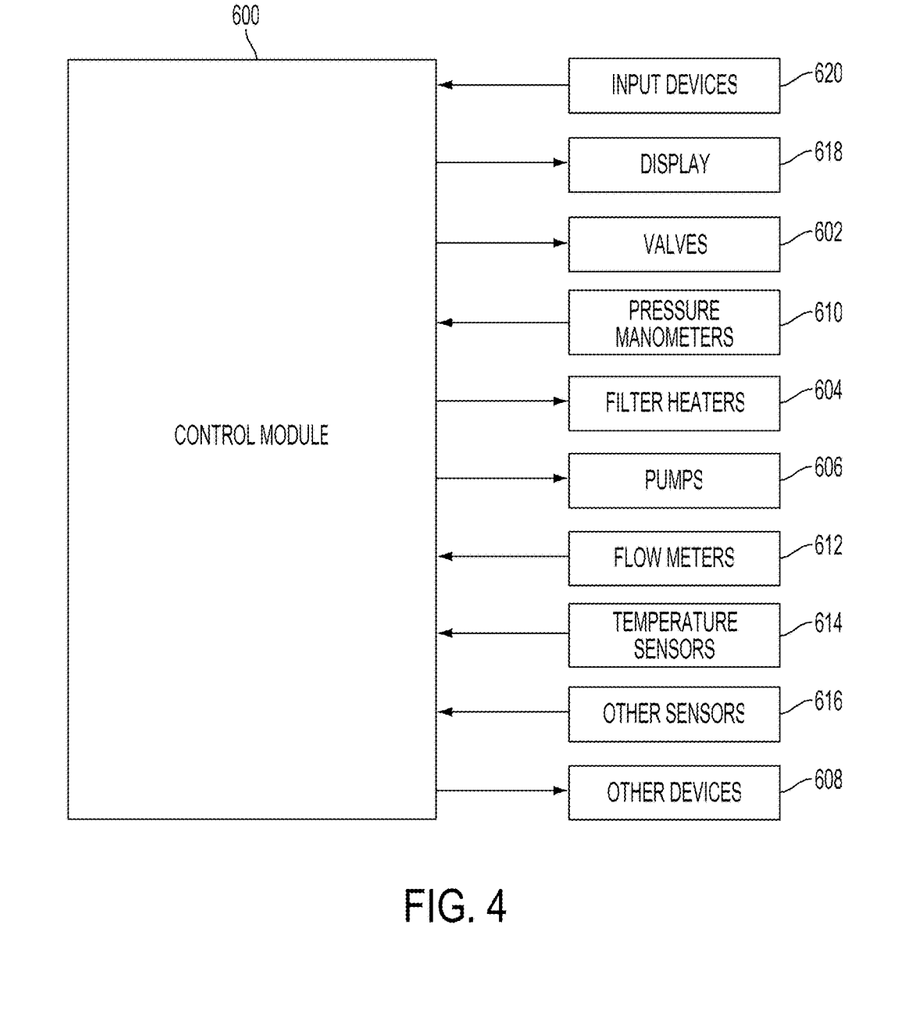
FIG. 4 illustrates a simplified block diagram of a control module used in controlling various components of the system, in one embodiment.

In one embodiment, the power source 258 is coupled to a control module, such as the one shown in FIG. 4, so that the control module can control the electricity applied to the heating element 216, thereby controlling the temperature of the vertical component (i.e., sidewall 212a) of the spacer 212. In one embodiment, a heat sensor (not shown) is provided in the spacer 212 to sense the temperature of the sidewall 212a defined by the vertical component of the spacer 212. The heat sensor is connected to the control module so that the temperature sensed by the heat sensor is fed back to the control module. The control module may use the feedback from the heat sensor to determine if the power applied to the heating element 216 needs to be increased or decreased. For example, if the temperature sensed by the heat sensor is high, then the control module may reduce or cease the power supplied to the heating element 216. Alternately, if the temperature sensed is low, then the control module may send a signal to the power source to increase the power supplied to the heating element 216. This allows the heating element 216 to maintain the sidewall 212a of the spacer 212 at a steady temperature in an ideal range.

Figure 3A:
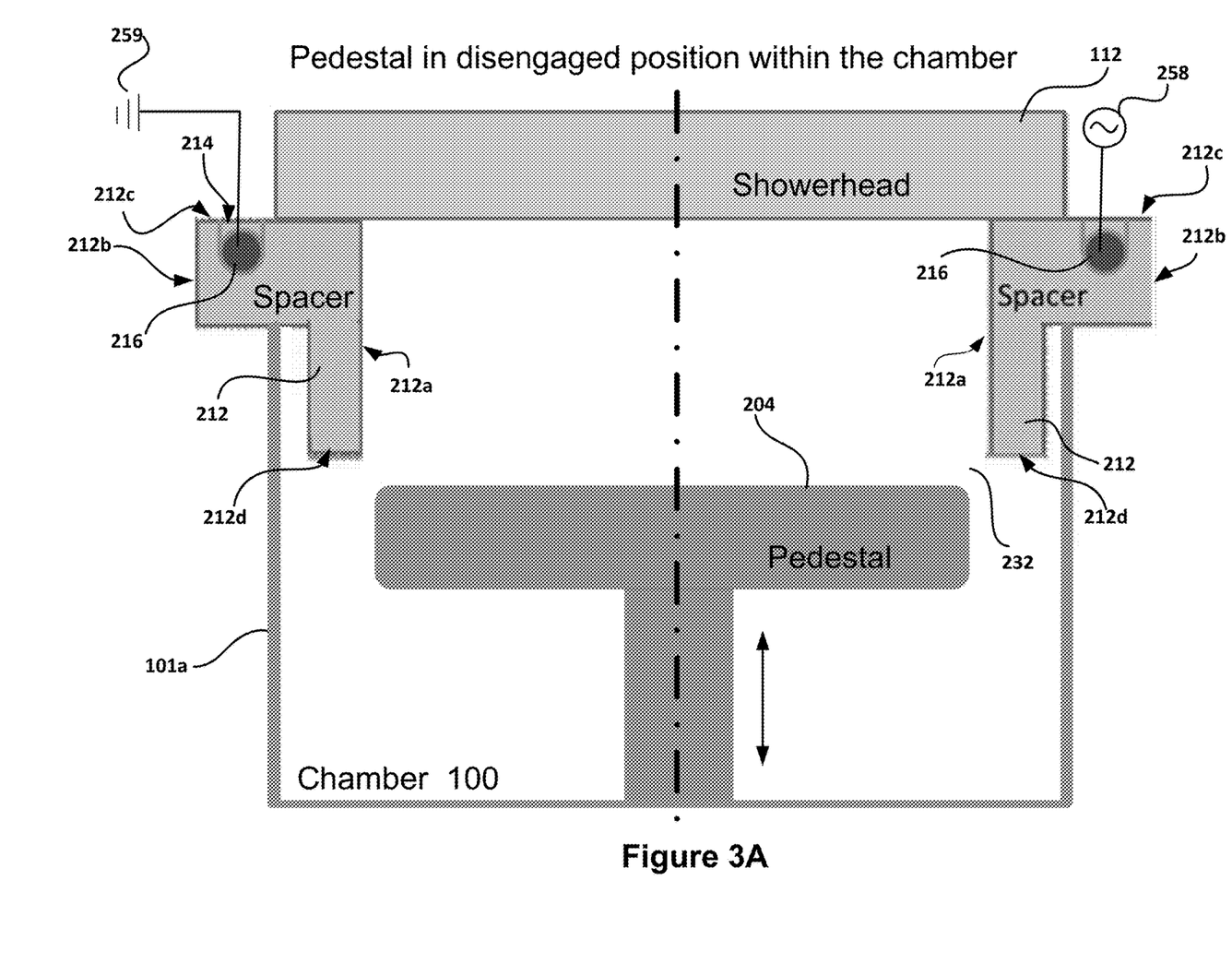
FIG. 3A illustrates a simplified block diagram of the system, wherein the pedestal is in a disengaged position within a chamber used for processing the substrate, in one implementation.
Figure 3B:
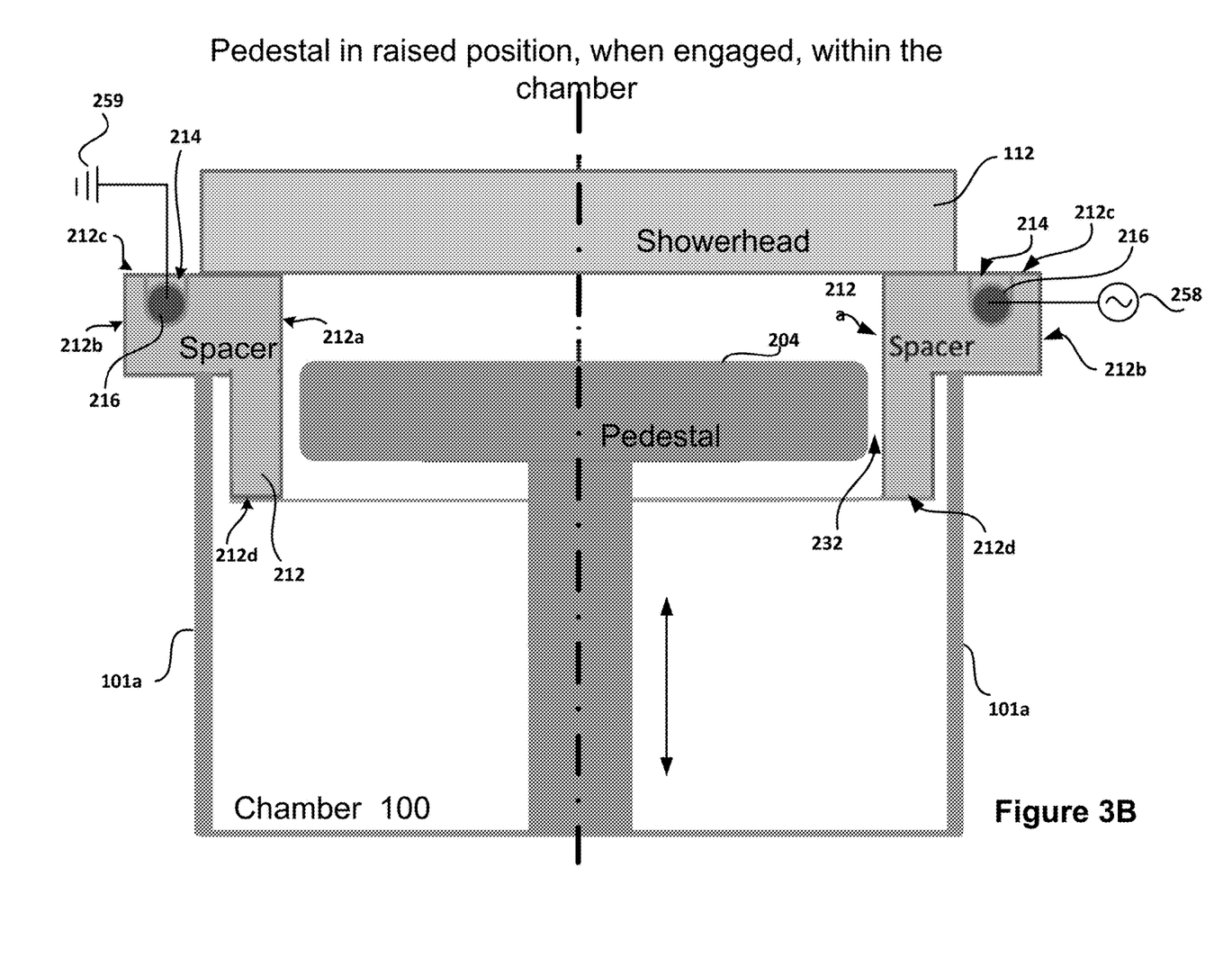
FIG. 3B illustrates a simplified block diagram of the system, wherein the pedestal is in an engaged position within the chamber during processing of the substrate, in one implementation.

FIGS. 3A and 3B illustrates a simplified block diagram depicting relative position of a pedestal 204 within a chamber defined in a system 100, in one embodiment. When the chamber is not being used for any fabrication operation, the pedestal 204 is in a disengaged position, as illustrated in FIG. 3A. In the disengaged position, a bottom surface 212d of the vertical component of the spacer 212 inside the chamber is above and to a lateral side of a top surface of the pedestal 204, such that a gap 232 between an outside edge of a support surface of the pedestal 204 and the sidewall 212a of the spacer 212 is substantial. FIG. 3A shows the gap 232 between the outside edge of the support surface of the pedestal 204 and the sidewall 212a of the spacer 212 when the pedestal 204 is in a disengaged position.

When a fabrication operation is to be performed in the process chamber, the pedestal 204 is raised upward to a process position by activating the lift mechanism. The upward movement of the pedestal 204 causes the support surface of the pedestal 204 from being below the bottom surface 212d of the vertical component of the spacer 212 to be in line or little above a bottom surface 212d of the spacer 212. The amount of upward movement and the process position of the pedestal 204, in some embodiment, may depend on the type of processing that is being done on the substrate and the process condition requirements for the process type. For instance, different processes may require different type of temperature controlling in the processing region so as to minimize any heat lost through the gap and the chamber wall. In the process position, the gap 232 between the outside edge of a support surface of the pedestal 204 and the sidewall 212a of the spacer 212 is narrowed. FIG. 3B illustrates an example embodiment wherein the pedestal 204 is engaged in a process position. Further, in the process position, the support surface of the pedestal 204 is at a higher level than a bottom surface 212d of the spacer 212.

Referring back to FIG. 2C, the dimensions (e.g., height, width, inner diameter, outer diameter, etc.) of the spacer 212 are important aspects to be considered in order to provide optimal plasma processing within the processing region 234. For example, the sidewall 212a defined by the vertical component of the spacer 212 extends a height 'h1' so as to substantially cover a length of the processing region 234, and a thickness 'd1' so as to define a gap between the support surface of the pedestal 204 and the sidewall 212a of the vertical component to allow the process gas to flow out from the processing region 234. In one embodiment, the height h1 of the spacer 212 is defined so that a bottom surface of the vertical component of the spacer 212 extends below a top surface of the pedestal 204, when the pedestal 204 is in a process position.

In one embodiment, the height h1 of the sidewall 212a of the spacer 212 is between about 3.0" to about 4.0". In an example embodiment, the height h1 of the sidewall 212a of the spacer 212 is about 3.4". In one embodiment, the thickness d1 of the bottom portion of the vertical component of the spacer 212 is between about 1" to about 2". In another embodiment, the thickness of the bottom portion of the spacer 212 is between about 1.2" to about 1.6". In some example embodiment, the thickness of the spacer 212 is about 1.3". In one embodiment, a gap 232 of between about 0.20" to about 0.50" is defined between the inner sidewall of the spacer 212 and the outside edge of the support surface of the pedestal 204. In another embodiment, the gap 232 is about 0.35".

Figure 3C:
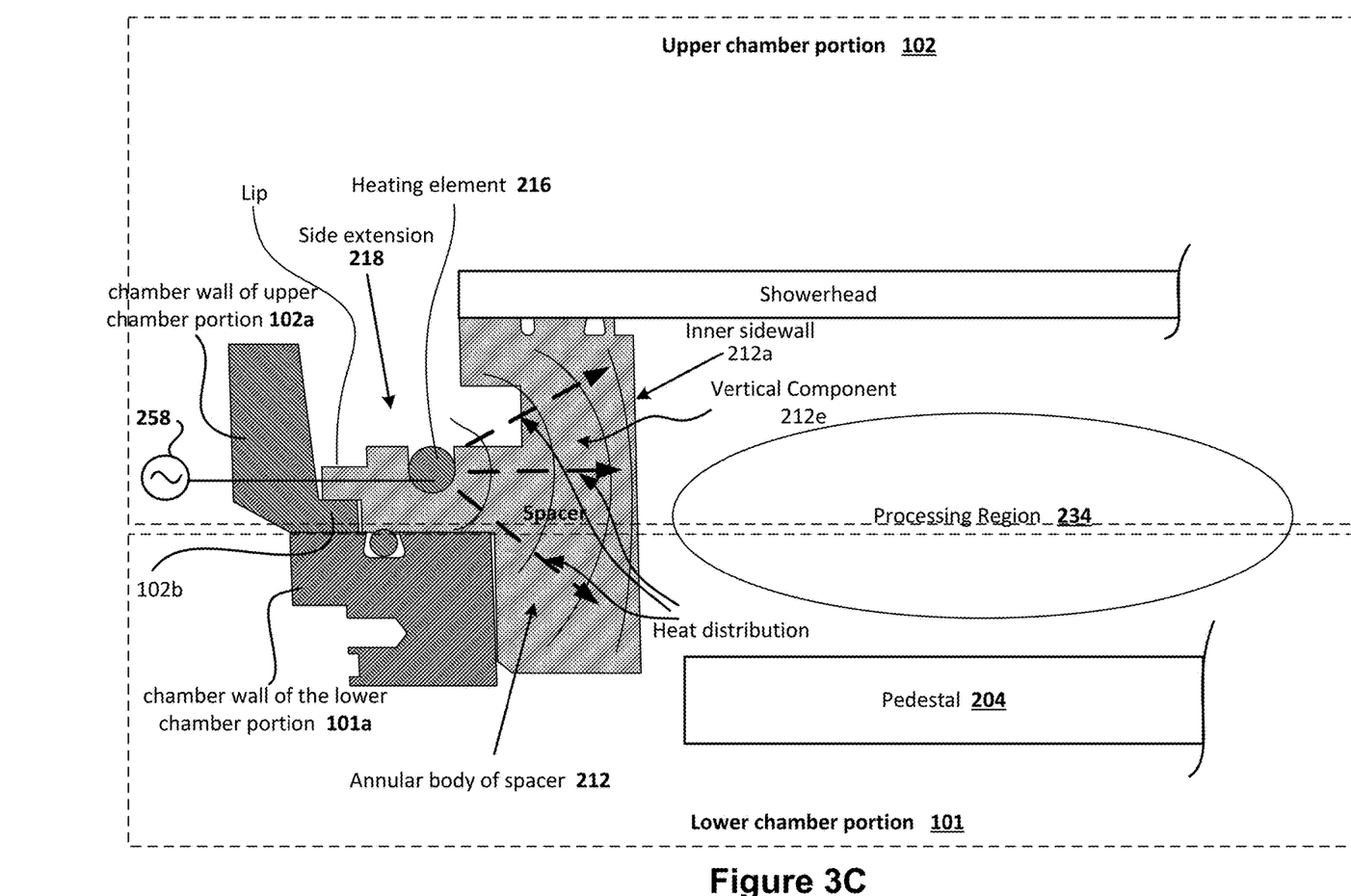
FIG. 3C provides an illustration of the heating element dissipating heat within the spacer, in one implementation.

FIG. 3C illustrates dissipation of heat from a heating element 216 within the spacer 212, in one example embodiment. Only a portion of the chamber is shown to provide a better understanding of the dissipation of heat within the bulk of the spacer 212. The heat provided by the power source 258 is transmitted by the heating element 216 radially outward toward the bulk of the spacer 212. Due to minimal surface area of the spacer 212 present in the side extension 218, majority of the heat from the heating element 216 is directed toward the vertical component (212e) of the spacer 212. As a result, the heat dissipates radially out and toward the sidewall 212a of the vertical component 212e defined in the annular body of spacer 212, in the direction of the concentric arcs (shown by the broken arrows in FIG. 3C). The heat dissipation is more intense in the region of the spacer that is closest to the heating element 216 and is more uniform away from the heating element 216, as can be seen from the curvature of the concentric arcs—i.e., more curvature near the heating element 216 and flattening as it reaches the sidewall 212a of the spacer 212. The location of the heating element 216 and the dimensions of the various parts of the spacer 212 are designed to provide a substantially symmetric distribution of heat to the vertical component 212e of the annular body of the spacer 212 so that the heat at the sidewall 212a of the spacer 212 is maintained at an ideal range.

The various embodiments described herein provide ways to improve particle performance within a chamber by increasing the surface temperature from room temperature to a higher value. The best particle performance, in one embodiment, is seen when the surface temperature is raised to about 150° C. In one embodiment, the geometry of the spacer, including the inner diameter, boundary of the spacer, height, coarseness of the sidewall, etc., are important aspects that define smooth plasma profile between the showerhead, the pedestal and the spacer. The smooth plasma profile will introduce less edge effect on the substrates, less recombination of reaction radicals on the sidewall of the spacer, a good temperature profile of the showerhead, the spacer and the pedestal. The geometry (e.g., tubular coil) of the heating element 216 is designed to increase the heat transfer efficiency between the heating element 216 and the main body (i.e., bulk) of the spacer 212. The geometry of the spacer 212 helps in maintaining the processing region at an optimal thermal and geometry conditions, causing less stress and peel off of depositions.

The control module 600 may control the various components of the system during a fabrication operation. For example, the control module 600 controls the power supply to the various components including the heating element 216, coil 108, etc. In one embodiment, the pedestal 204 may be a powered electrode. In this embodiment, the pedestal 204 is electrically coupled to power supply (not shown) via a match network (not shown). In an alternate embodiment, power supply may be electrically connected through a match network to a showerhead 112, instead of the pedestal 204. The power supply to the pedestal 204 or the showerhead 112 is controlled by the control module 600, e.g., a controller. The control module 600 is configured to operate the system 100 by executing process input and control 608. The process input and control 608 may include process recipes, such as power levels, timing parameters, gas chemistries, and may also control mechanical movement of the substrate 103, pedestal 204, etc., so as to expose the different portions of a surface of the substrate 103 to plasma.

The control module 600 may control the delivery of gas chemistry from the reservoir 161 (i.e., gas source of FIG. 1) to the chamber and from the chamber out through a drain defined in the lower chamber portion. Gas chemistry flows out of the chamber via the gap 232 defined between the pedestal 204 and the spacer 212 toward the drain. A vacuum pump (e.g., a one or two stage mechanical dry pump and/or a turbomolecular pump) is used to draw gas chemistries out and to maintain a suitably low pressure within the chamber by a close loop controlled flow restriction device, such as a throttle valve or a pendulum valve.

FIG. 4 shows an example control module 600 for controlling the various components of a system described above. In one embodiment, the control module 600 may include a processor, memory and one or more interfaces. The control module 600 may be employed to control devices in the system based in part on sensed values. For example only, the control module 600 may control one or more of valves 602, filter heaters 604, pumps 606, lift mechanisms and other devices (i.e., process input and control devices) 608, based on the sensed values and other control parameters. The control module 600 receives the sensed values from, for example only, pressure manometers 610, flow meters 612, temperature or heat sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature (which includes surface temperature in the processing region), wafer temperature, RF power levels, wafer chuck or pedestal position, power to the coil, power to the heating element, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, to the heating elements, heating coil(s), the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 610, temperature or heat sensors, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A chamber for processing a substrate, the chamber comprising:
 a lower chamber portion that includes a lower chamber wall and an upper chamber portion that includes an upper chamber wall;
 a showerhead disposed in the upper chamber portion;

a pedestal disposed in the lower chamber portion, the pedestal having a support surface for supporting the substrate, when present, the support surface of the pedestal configured to be oriented under the showerhead, such that a processing region is defined between the support surface of the pedestal and the showerhead;
a spacer disposed to be in direct contact between the showerhead and the lower chamber wall, the spacer is defined by,
an annular body with a vertical component that defines a sidewall that surrounds the processing region inside of the lower chamber wall;
the annular body includes a side extension that is disposed outside of the processing region, the side extension projects radially outward from a top of the vertical component and over the lower chamber wall;
the annular body includes a groove that is formed in a portion of a top surface of the side extension that is extending over the lower chamber wall such that the groove is formed in a part of the spacer that is outside of the lower chamber wall, the groove is configured to surround the vertical component of the annular body; and
a heating element being embedded in the groove of the side extension.

2. The chamber of claim 1, wherein the heating element is connected to a power source at a first end and to an electrical ground at a second end, such that the heating element is configured to conduct heat in a substantially symmetric distribution across the annular body.

3. The chamber of claim 1, wherein the groove is configured to allow an overlap of a portion of the heating element at opposite ends.

4. The chamber of claim 1, wherein the annular body of the spacer is connected to a bottom surface of the showerhead along an outer periphery of the showerhead.

5. The chamber of claim 1, wherein the sidewall of the vertical component facing the processing region is spaced apart from an outside edge of the support surface of the pedestal to define a gap there-between, wherein a size of the gap is between about 0.20 inches to about 0.50 inches.

6. The chamber of claim 1, wherein the annular body includes a second groove formed on a top surface of the annular body between a center of the top surface and an inner edge, and
a third groove formed on the top surface of the annular body between a center of the top surface and an outer edge,
wherein an O-ring is embedded in the second groove and a radio frequency gasket is embedded in the third groove.

7. The chamber of claim 1, wherein the side extension of the annular body is configured to sit on top of the lower chamber wall to substantially seal the processing region.

8. The chamber of claim 1, further includes a cutout defined along an outer sidewall of the annular body immediately above the side extension and adjacent to the groove, the cutout is a C-shaped cutout with an opening of the C-shaped cutout facing the heating element embedded in the groove, the cutout disposed into the outer sidewall of the annular body.

9. The chamber of claim 1, wherein the showerhead is connected to a plasma chamber, wherein the plasma chamber is separate and external to the chamber.

10. A system for processing a substrate, the system comprising:
a chamber having a lower chamber portion that includes a lower chamber wall and an upper chamber portion that includes an upper chamber wall, and the upper chamber portion having a plasma chamber;
a showerhead disposed below the plasma chamber in the upper chamber portion;
a pedestal disposed in the lower chamber portion, the pedestal having a support surface for supporting the substrate, when present, the support surface of the pedestal configured to be oriented under the showerhead, such that a processing region is defined between the support surface of the pedestal and the showerhead;
a spacer disposed to be in direct contact between the showerhead and the lower chamber wall of the lower chamber portion, the spacer is defined by,
an annular body with a vertical component that defines a sidewall that surrounds the processing region inside of the lower chamber wall;
the annular body includes a side extension that is disposed outside of the processing region, the side extension projects radially outward from a top portion of the vertical component and over the lower chamber wall;
the annular body includes a groove that is formed on a top surface of the side extension in a portion that is extending over the lower chamber wall such that the groove is formed in a part of the spacer that is outside of the lower chamber wall, the groove is configured to surround the vertical component of the annular body; and
a heating element being embedded in the groove of the side extension, such that the heating element is disposed over the lower chamber wall and outside of the processing region.

11. The system of claim 10, wherein the heating element is connected to a power source at a first end and to an electrical ground at a second end, and
wherein the direct contact is thermal contact.

12. The system of claim 10, wherein the heating element is configured to conduct heat in a substantially symmetric distribution across the annular body, such that the vertical component exposes controlled heat profile to the sidewall that surrounds the processing region.

13. The system of claim 10, wherein the annular body of the spacer is connected to the showerhead along an outer periphery of the showerhead.

14. The system of claim 10, wherein the sidewall of the vertical component facing the processing region is spaced apart from an outside edge of the support surface of the pedestal to define a gap there-between.

15. The system of claim 14, wherein a size of the gap is between about 0.20 inches to about 0.50 inches.

16. The system of claim 10, further includes a cutout defined along an outer sidewall of the annular body immediately above the side extension and adjacent to the groove, the cutout is a C-shaped cutout with an opening of the C-shaped cutout facing the heating element embedded in the groove, the cutout disposed into the outer sidewall of the annular body.

17. The system of claim 10, further includes a lip extending radially outward from an outer sidewall of the side extension, the lip is configured to sit on top of an extension lip defined on a bottom side of the upper chamber wall of the upper chamber portion, wherein the extension lip projects radially inward from the bottom side of the upper chamber wall.

18. The system of claim 17, wherein the upper chamber wall of the upper chamber portion substantially surrounds the side extension of the spacer.

19. The system of claim 10, wherein the side extension of the spacer is configured to sit on top of an O-ring embedded in a second groove defined on a top surface of the lower chamber wall of the lower chamber portion.

20. The system of claim 10, wherein the annular body includes,
   a third groove formed on a top surface of the annular body between a center of the top surface and an inner edge, and
   a fourth groove formed on the top surface of the annular body between a center of the top surface and an outer edge,
   wherein an O-ring is embedded in the third groove and a radio frequency gasket is embedded in the fourth groove.

21. The system of claim 10, wherein the groove formed in the side extension is configured to allow an overlap of a portion of the heating element at opposite ends.

22. The system of claim 10, wherein the heating element is encased in an outer shell, the outer shell is made of stainless steel material.

23. The system of claim 10, wherein a thickness of the vertical component of the spacer is between about 1 inch to about 2 inches.

24. The system of claim 10, wherein a height of the vertical component of the spacer is between about 2.5 inches to about 4.5 inches.

25. The system of claim 10, wherein the plasma chamber is disposed immediately above the showerhead and is coupled to a reservoir to receive gas chemistry, at least one heating coil coupled to a power source is disposed on an outer wall of the plasma chamber so as to encircle a portion of the plasma chamber, the at least one heating coil is configured to conduct heat to the gas chemistry within the plasma chamber.

26. The system of claim 25, wherein the plasma chamber includes a diffuser disposed within, the diffuser is connected to the reservoir and includes injection openings to supply the gas chemistry to the plasma chamber.

* * * * *